(12) United States Patent
Arvin et al.

(10) Patent No.: US 9,735,071 B2
(45) Date of Patent: Aug. 15, 2017

(54) METHOD OF FORMING A TEMPORARY TEST STRUCTURE FOR DEVICE FABRICATION

(71) Applicant: International Business Machines Corporation, Armonk, NY (US)

(72) Inventors: Charles L. Arvin, Savannah, GA (US); Brian Michael Erwin, Lagrangeville, NY (US); Gary W. Maier, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/835,449

(22) Filed: Aug. 25, 2015

(65) Prior Publication Data

US 2017/0062291 A1    Mar. 2, 2017

(51) Int. Cl.
   *H01L 21/66* (2006.01)
   *H01L 21/48* (2006.01)
   *G01R 31/04* (2006.01)
   *H01L 23/00* (2006.01)

(52) U.S. Cl.
   CPC ............ *H01L 22/32* (2013.01); *G01R 31/04* (2013.01); *H01L 21/486* (2013.01); *H01L 22/14* (2013.01); *H01L 24/05* (2013.01); *H01L 24/11* (2013.01); *H01L 24/13* (2013.01)

(58) Field of Classification Search
   CPC combination set(s) only.
   See application file for complete search history.

(56) References Cited

U.S. PATENT DOCUMENTS

| 5,374,893 A | 12/1994 | Koopman et al. |
| 5,505,320 A | 4/1996 | Burns et al. |
| 6,242,932 B1 | 6/2001 | Hembree |

(Continued)

*Primary Examiner* — Kyoung Lee
*Assistant Examiner* — Ratisha Mehta
(74) *Attorney, Agent, or Firm* — Cantor Colburn LLP

(57) ABSTRACT

A method of forming a temporary test structure for device fabrication is provided. The method is particularly useful for electrically testing conductive interconnects during controlled collapse chip connections (C4) fabrication and/or through-silicon vias (TSVs) during interposer fabrication. The method includes providing a substrate containing a plurality of electrically conductive interconnects extending vertically to top surface of the substrate. A temporary test structure is formed to connect the plurality of interconnects and for electrical testing. The suitable material for the temporary test structure is TiW for a single layer structure, or Cu or Cu alloy over Ti or TiW for a bilayer structure with thickness in a range of about 20 nm to 1200 nm. Excimer laser ablation can be used to form the temporary test structure. Electrical testing is performed on the substrate by probing at different test locations on the temporary test structure. All or part of the temporary test structure is removed so as not to affect product performance, and the substrate can be further processed with normal processes. The temporary test structure may contain electrical test pads which provide a way to make temporary connections to small interconnect landings or features at extreme tight pitch to fan them out to testable pads sizes and pitches.

11 Claims, 13 Drawing Sheets

(56) References Cited

U.S. PATENT DOCUMENTS

| | | |
|---|---|---|
| 6,400,169 B1 | 6/2002 | Hembree |
| 6,426,636 B1 | 7/2002 | Das et al. |
| 7,675,301 B2 | 3/2010 | Eldridge et al. |
| 8,018,242 B2 | 9/2011 | Nakayama et al. |
| 8,310,259 B2 | 11/2012 | Hamel et al. |
| 8,680,882 B2 | 3/2014 | Tseng et al. |
| 8,735,276 B2 * | 5/2014 | Chung .................... H01L 24/03 257/691 |
| 8,832,936 B2 | 9/2014 | Hougham et al. |
| 8,901,949 B2 | 12/2014 | Kwon et al. |
| 8,901,950 B2 | 12/2014 | Desta et al. |
| 8,993,432 B2 | 3/2015 | Hou et al. |
| 2008/0018350 A1 | 1/2008 | Chao et al. |
| 2009/0033337 A1 | 2/2009 | Pasco |
| 2012/0326296 A1 * | 12/2012 | Choi ................... H01L 23/3171 257/737 |
| 2013/0299221 A1 | 11/2013 | Oh et al. |
| 2013/0342231 A1 | 12/2013 | Alfano et al. |
| 2013/0342232 A1 | 12/2013 | Park |
| 2015/0048861 A1 | 2/2015 | Kuo et al. |

\* cited by examiner

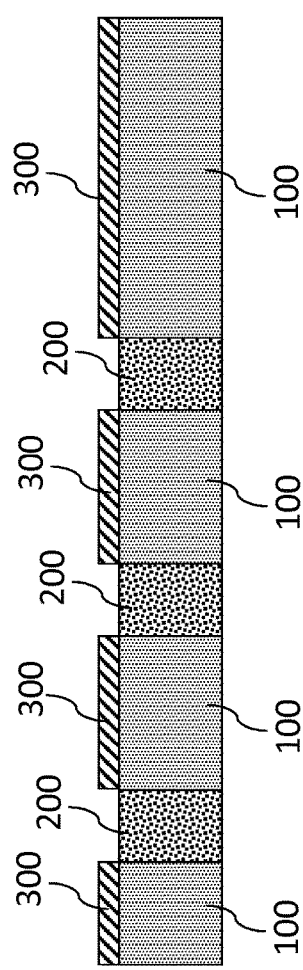
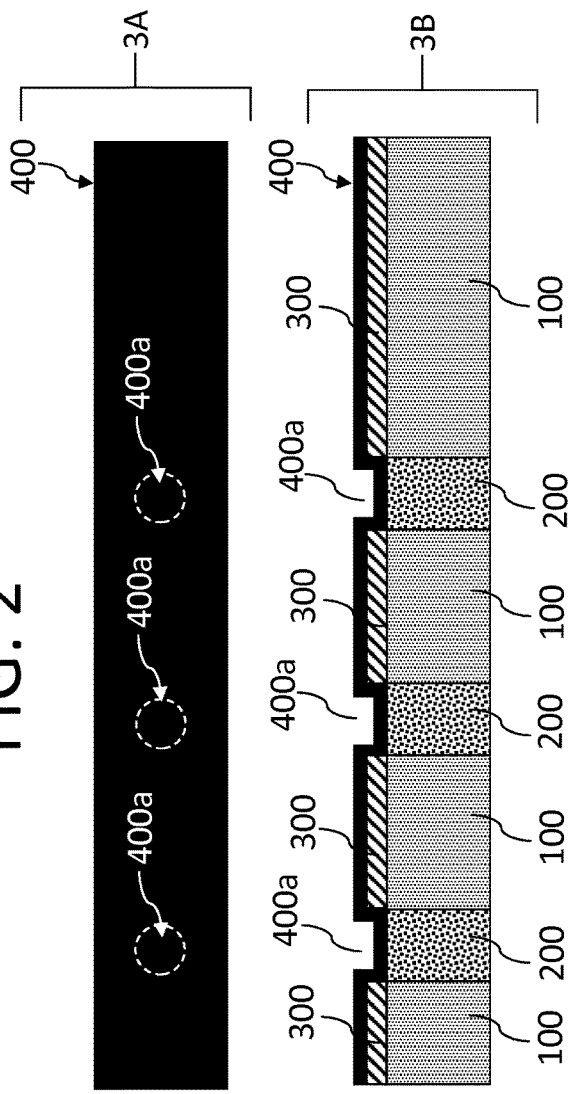
FIG. 2
FIG. 3

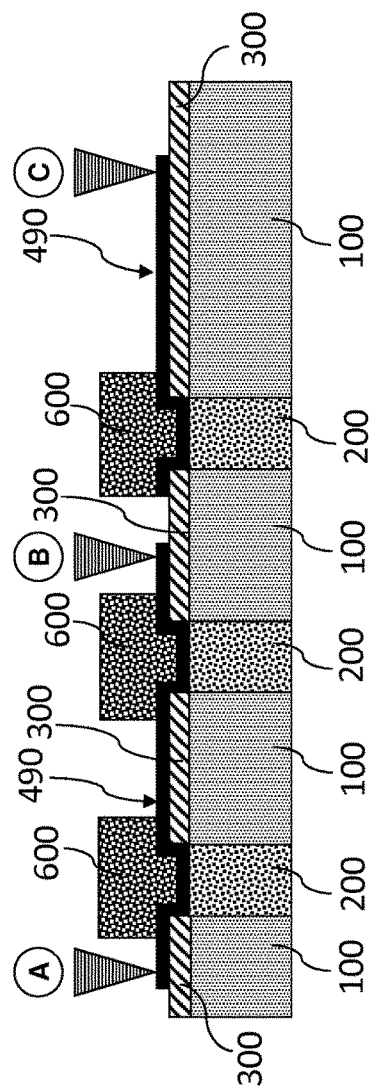
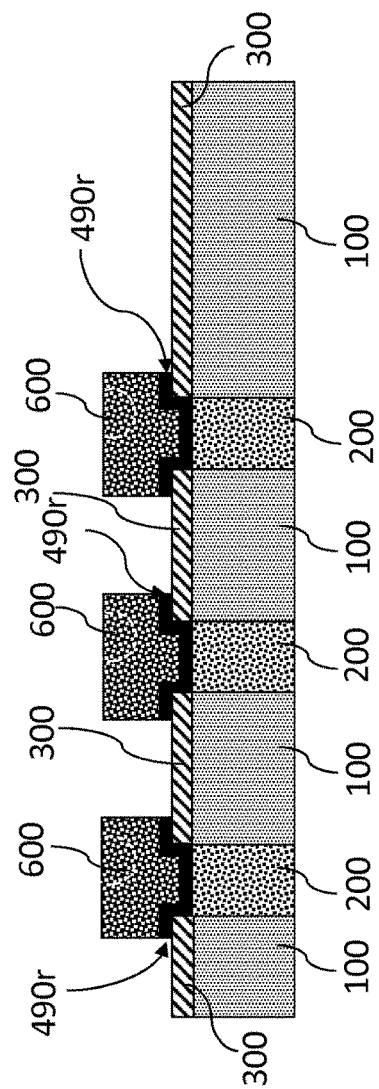
FIG. 9
FIG. 10

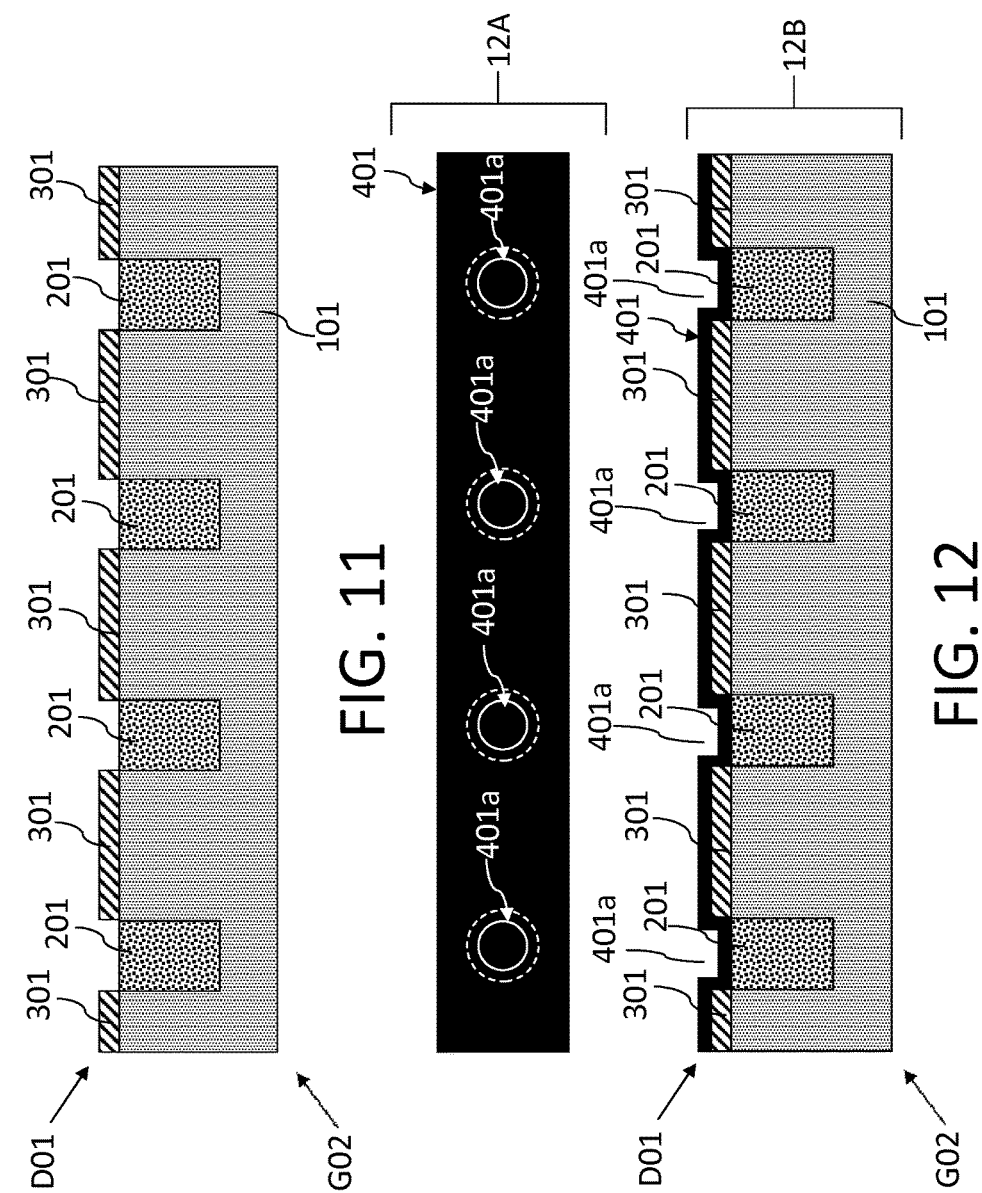

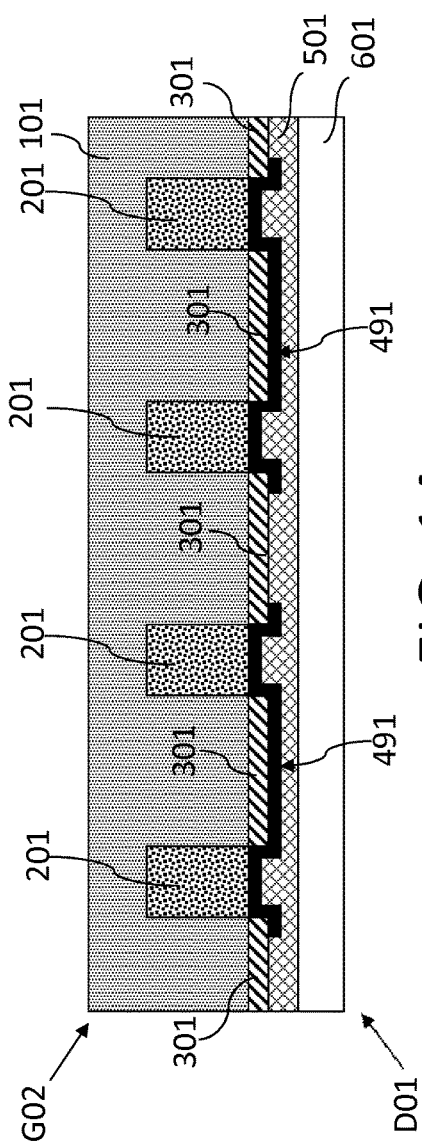
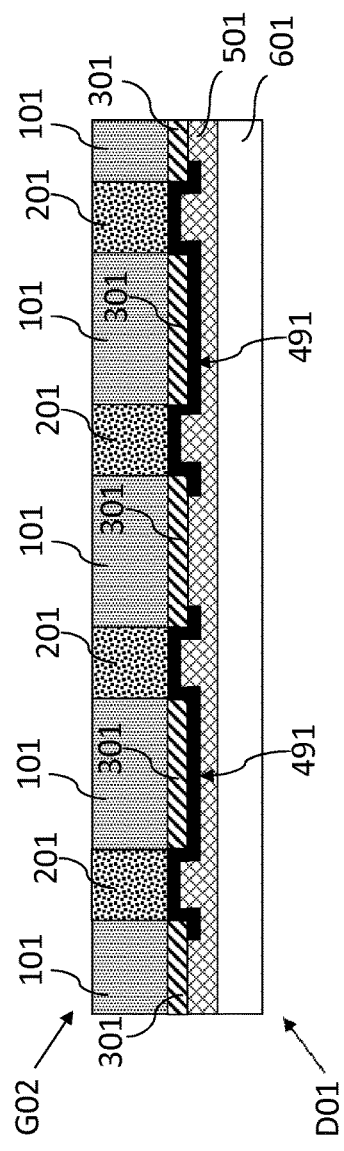

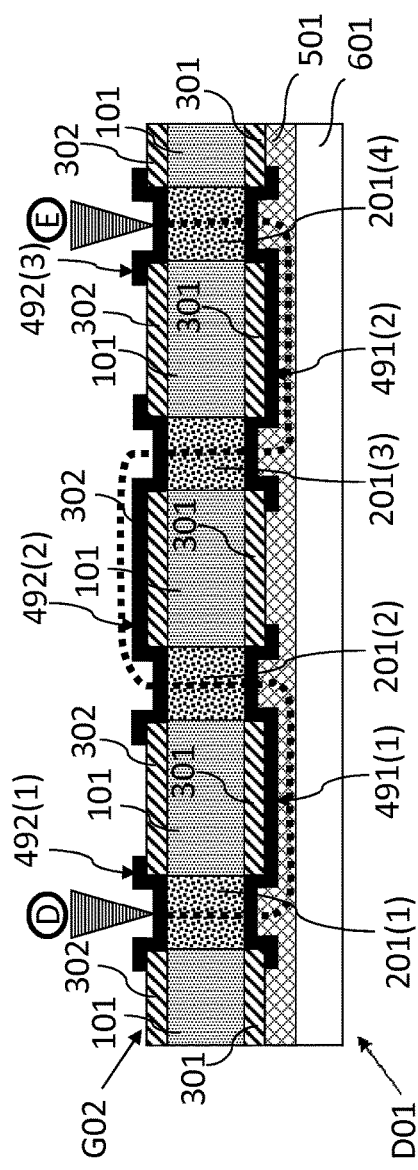
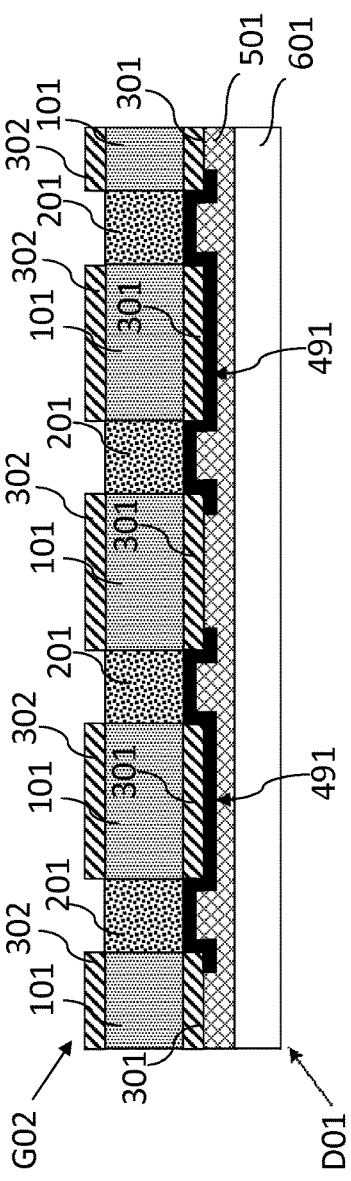
FIG. 18
FIG. 19

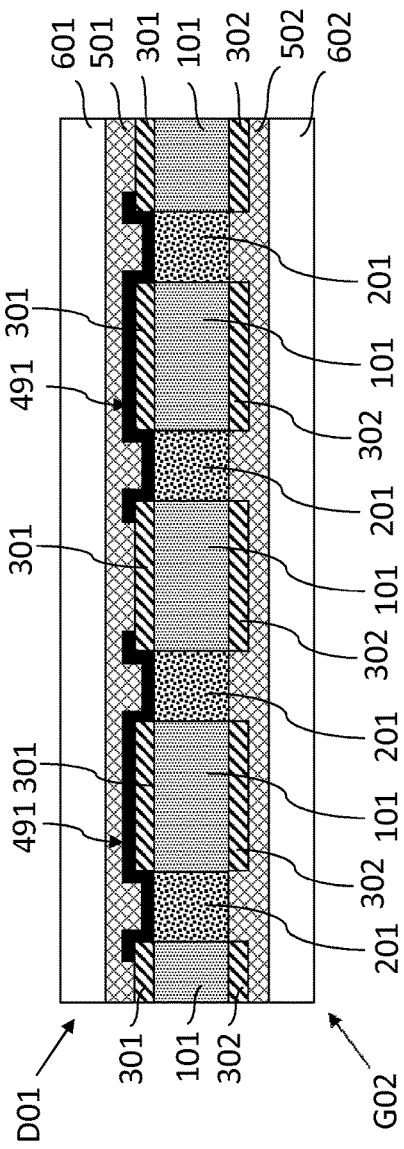
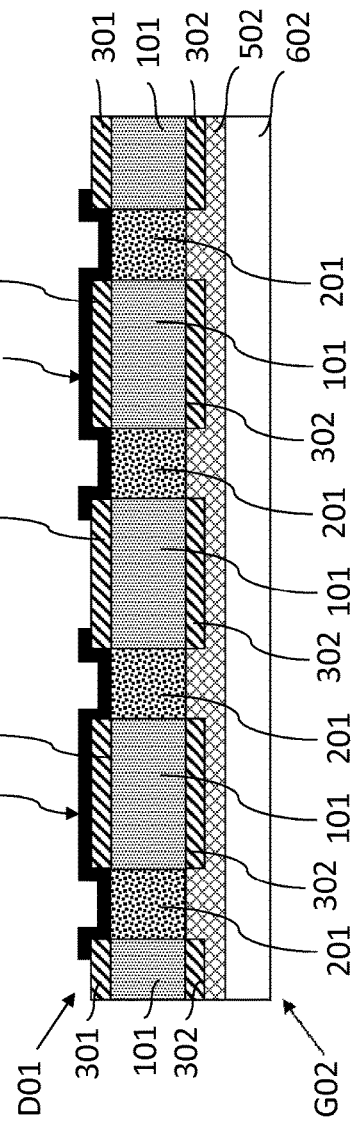
FIG. 20
FIG. 21

METHOD OF FORMING A TEMPORARY TEST STRUCTURE FOR DEVICE FABRICATION

FIELD OF THE INVENTION

This invention relates generally to a method of forming a temporary test structure for device fabrication, and more particularly to a method of forming a temporary electrical test structure for testing conductive interconnects during C4 fabrication or for testing TSVs during interposer fabrication.

BACKGROUND OF THE INVENTION

The ever increasing density of input/output (I/O) connections required between an integrated circuit (IC) chip and its next level packaging in microelectronic systems has rendered the industry increasingly turning to an C4 (controlled collapse chip connections) interconnection technology, which uses solder bumps or solder balls to electrically and mechanically connect the chip I/O pads to pads on a next level of packaging. At the same time, to achieve better performance with reduced power consumption, reduced power dissipation and smaller footprint, the industry also increasingly adopts a three dimensional (3D) integrated circuit. The 3D integrated circuit is manufactured by stacking silicon wafers and/or dies and interconnecting them vertically using through-silicon vias (TSVs) so that they behave as a single device. Both C4 solder bumps and TSVs require electrical testing to ensure their electrical performance and reliability.

Cobra probes have been commonly used in testing of the IC devices containing an area with an array of C4 bumps or similar electrical contacts. A cobra probe normally comprises a plurality of wires (pins) which are mounted in parallel with their respective ends terminating in two planes which extend transversely of the axes of the probe wires. The wires are preshaped and flexible, which fulfills two of the numerous requirements to render them highly successful in probing silicon device wafers. In addition, cobra probes have less force required and thus less damage to the device being tested. Recently, very low force, fine pitch test probes are being developed but have many challenges to overcome. The processes used to manufacture these probes are expensive which makes it even more challenging to reduce the rising test costs expected for 3D and 2.5D integration. While these new probes further extend the ability to test more I/O's, finer pitches, and smaller features, they will again hit road blocks for testing future 3D designs with exploding power and signal connections. Also, 3D wafer to wafer manufacturing features which will shrink beyond the physical and mechanical capability of these new probes. New test probes will likely be limited to 40-50 µm pitch and 20-25 µm test pads. Also, even though they may be able to achieve very low forces below 1 g with minimal damage, they may not be usable in more sensitive processes such as wafer to wafer where any wafer surface disruption can affect the process. In some cases there may be no product test pads available but it may be beneficial to have them to monitor small process variations earlier in the process. As technologies continue to scale, these small variations effecting product are getting more difficult or near impossible to detect with process defect monitors (PDMs). Therefore, there is a need to provide a new method which can address these issues during the C4 manufacturing process or any electrically tested level process, such as testing TSVs for interposer manufacturing process.

Current test solutions allow for assessment of TSV leakage, but do not provide capacity to test for opens. Manufacturing process monitors which include connected TSV chains can be used to monitor a process for opens, shorts, and proximity effects to devices. However, due to the very small critical area of these monitors and lack of unique product design sensitivities to the process, these monitors traditionally become ineffective for product health of the line (HOL) and yield monitoring.

Product known good die (KGD) test is required during high volume manufacturing. DC and AC limited yield problems can cause large product wafer yield loss at significant cost when the problem is discovered during manufacturing final assembly and test steps. A much larger cost is the interruption in the product supply chain followed by the very large costs and fab capacity required for new wafer starts to make up for the product wafers lost. KGD testing for product also requires testing for AC performance and reliability fail mechanisms. Typically these types of fail modes are more difficult to detect and generally are tested for much later in the product assembly process. The only way to guarantee product KGD is to AC test the product critical performance paths. Temporary connections of these paths allow for such testing much earlier in the manufacturing process at any selected wafer level. This has become even more critical due to 3D, 2.5D, and package scaling which limits or eliminates assembly rework processes further impacting cost and yield. These connections enable 100% KGD test coverage for both tester methods and on chip DFT methods.

Current solutions at any wafer test level, including product wafer final test, are also challenged to provide 100% KGD testing due to smaller test interface features, tighter pitches, and exploding I/O interfaces expected to run at high speeds. This effects both KGD yield, but also drives higher test costs and new test development. Current on chip at speed test methods are being discussed but cannot measure through the TSV path. For 2.5D interposers or 3D designs, chip design for test (DFT) features like built in self test (BIST) or DC and AC I/O wrap can now be activated to do more effective I/O wrap tests which include the entire TSV path. In addition, testing a new design earlier in the process provides a means for early user hardware design verification. Designs can then be fixed more quickly during the initial development of a program. Lastly, manufacturing tools Key Performance Indicators (KPI) can be better monitored such as a degradation in a membrane sealing system for copper plating. In this case, the time between plating and a final level test step can cause large volumes of wafer yield loss and/or tool contamination or tool damage impacting production due to tool down time. Therefore, there is a need to provide a process which can form temporary electrical connections between TSVs which will enable electrical testing of TSVs in the early stage of the process during 3D manufacturing.

Tseng et al., in U.S. Pat. No. 8,680,882, teach a method of making an interposer for a 3D IC by providing with a plurality of functional metal wiring segments where the plurality of functional metal wiring segments are connected in series by a plurality of dummy metal wiring segments thus allowing the plurality of functional metal wiring segments to be electrically tested for continuity. Each of the plurality of dummy metal wiring segments is provided with a laser fuse portion for disconnecting the dummy metal wiring segments upon completion of the electrical test. Tseng et al. discuss how to deposit a permanent structure onto a substrate that will later be disconnected electrically but will still remain with the package and the pads themselves. This leads to reliability issues during assembly and consumes the very space that the fine pitch provides.

Hou et al., in U.S. Pat. No. 8,993,432, teach a method and an apparatus for testing the electrical characteristics, such as electrical continuity. A substrate, such as a wafer or an interposer, having a plurality of through vias (TVs, also called TSVs) is provided. Along one side of the substrate, a conductive layer electrically couples two or more of the TVs. Thereafter, the electrical characteristics of the TVs may be tested by, for example, a probe card in electrical contact with the TVs on the other side of the substrate. During testing, current passes through a first TV from a first side of the substrate, to the conductive layer on a second side of the substrate, to a second TV, and back to the first side of the substrate through the second TV. Although the conductive layer may be temporary, the probe test is still carried out on the TVs not on the temporary conductive layer, it does not address many issues associated with the electrical testing described above. Therefore, there is a need to provide a temporary test structure which can address these issues for testing TSVs during interposer fabrication.

SUMMARY OF THE INVENTION

According to an aspect of the present invention, there is provided a method for forming a temporary test structure for device fabrication containing: providing a substrate containing a plurality of electrically conductive interconnects extending vertically to top surface of the substrate; conformally forming an electrical test layer on top of the substrate, the electrical test layer connecting to the plurality of electrically conductive interconnects; patterning the electrical test layer by selectively removing portions of the electrical test layer to form a temporary test structure which contains unremoved portions of the electrical test layer and includes providing electrical connection between at least a first test location and a second test location, wherein the first and second test locations are each electrically connected to at least one of the plurality of electrically conductive interconnects; performing electrical testing by probing at least the first test location and the second test location on the temporary test structure; and removing all or part of the temporary test structure.

The provided substrate may be a dielectric substrate or a semiconductor substrate. The semiconductor substrate may be a silicon wafer, a silicon germanium wafer, a silicon on insulator (SOI) wafer, or any other commonly used semiconductor wafer. Material of the electrical test layer may be copper (Cu), titanium (Ti), tungsten (W), tantalum (Ta), ruthenium (Ru), chromium (Cr), iridium (Ir), osmium (Os), palladium (Pd), platinum (Pt), or alloys or ceramics thereof. The electrical test layer may contain single layer or multilayer such as bilayer. The preferable single layer material is a seed layer material such as titanium tungsten alloy (Ti—W, or TiW). The preferable bilayer material is a layer of Cu or Cu alloy over a layer of Ti or TiW. Thickness of the electrical test layer may be in a range of about 20 nm to 1200 nm, preferably in a range about 50 nm to 900 nm, and more preferably in a range of about 100 nm to 700 nm. The exemplary bilayer thickness may contain a layer of TiW or Ti in a range of about 100 to 200 nm, and a layer of Cu or Cu alloy in a range of about 20 nm to 700 nm. The electrically conductive interconnects may be any commonly known interconnect structures including conductive vias. For 3D IC, the conductive vias may be TSVs. The preferable material for the conductive vias may be Cu or Cu—Al alloy.

In the step of removing all or part of the temporary test structure, it is preferred to completely remove all the temporary test structure, or at least to remove more than 50% of the temporary test structure. The removing method may contain wet chemical etching, reactive ion etching, inert gas sputtering, or laser ablation. In the step of patterning the electrical test layer by selectively removing portions of the electrical test layer to form a temporary test structure may contain: performing a laser ablation on the electrical test layer using an excimer laser through an ablation mask, which contains an electrical testing pattern, to selectively remove portions of the electrical test layer; and removing loose material of the electrical test layer to form the temporary test structure containing the electrical testing pattern. Alternatively, a lithographic process in combination with a reactive ion etching (RIE) process may be used to pattern the electrical test layer to form the temporary test structure.

The temporary test structure contains unremoved portions of the electrical test layer and includes providing electrical connection between at least the first test location and the second test location, wherein the first and second test locations are each electrically connected to at least one of the plurality of electrically conductive interconnects. Besides one test location may connect to one other test location such as the first and second test locations, one test location which includes the first and second test locations may electrically connect to more than one test locations, and one test location which does not include the first and second test locations may not have electrical connection to other test locations. The test locations may be electrical test pads. The electrical test pads provide a way to make temporary connections to small interconnect landings or features at extreme tight pitch to fan them out to testable pads sizes and pitches. The electrical test pads may be away from the electrical conductive interconnects and may be in kerf area. The step of performing electrical testing by probing at least the first test location and the second test location on the temporary test structure contains probing the temporary test structure with probe pins. The probe may include a cobra probe, a membrane probe, and a cantilever probe. The preferable probe is a cobra probe.

After conformally forming an electrical test layer and before patterning the electrical test layer, the method of present invention may further contain: forming C4 bumps over the plurality of electrically conductive interconnects. The temporary test structure may provide temporary electrical connections during the C4 manufacturing process. The temporary test structure may also provide more compliant pads for electrical testing thus may provide an alternate path to probing C4s, thus preventing damage to C4s.

According to another aspect of the present invention, there is provided a method for forming a temporary test structure for device fabrication containing: providing a substrate having a device side and a grind side, and containing a plurality of through-silicon vias (TSVs) extending vertically to top surface of the device side with a layer of a first insulating polymer covering the top surface except surfaces of the plurality of TSVs; conformally forming a first electrical test layer on the top surface of the device side, the first electrical test layer connecting to the plurality of TSVs; patterning the first electrical test layer by selectively removing portions of the first electrical test layer to form a first temporary test structure which contains unremoved portions of the first electrical test layer; applying a layer of a first adhesive over the top surface of the device side of the substrate, bonding a layer of a first carrier on top using the layer of the first adhesive, and flipping the substrate upside down; thinning the grind side of the substrate to reveal the plurality of TSVs; forming a layer of a second insulating polymer on top surface of the grind side with an insulating-layer pattern not covering surfaces of the plurality of TSVs; conformally forming a second electrical test layer on the top surface of the grind side, the second electrical test layer connecting to the plurality of TSVs; patterning the second electrical test layer by selectively removing portions of the second electrical test layer to form a second temporary test structure which contains unremoved portions of the second electrical test layer and includes providing electrical connection between at least a first test location and a second test location, wherein the first and second test locations are each electrically connected to at least one of the plurality of TSVs; performing electrical testing by probing at least the first test location and the second test location on the second temporary test structure; removing the second temporary test structure; applying a layer of a second adhesive over the top surface of the grind side of the substrate, bonding a layer of a second carrier on top using the layer of the second adhesive, and flipping the substrate upside down; debonding the layer of the first carrier and removing the layer of the first adhesive to reveal the first temporary test structure; and removing the first temporary test structure.

The provided substrate may be a dielectric substrate or a semiconductor substrate. The semiconductor substrate may be a silicon wafer, a silicon germanium wafer, a SOI wafer, or any other commonly used semiconductor wafer. The first carrier or the second carrier may be a glass carrier, a silicon carrier or any other suitable carrier. Material of the first electrical test layer and the second electrical test layer may be Cu, Ti, W, Ta, Ru, Cr, Ta, Ir, Os, Pd, Pt, or alloys or ceramics thereof. The first and second electrical test layers may contain the same material. The first and second electrical test layers may contain single layer or multilayer such as bilayer. The preferable single layer material is a seed layer material such as Ti—W alloy. The preferable bilayer material is a layer of Cu or Cu alloy over a layer of Ti or TiW. Thickness of the first electrical test layer and the second electrical test layer may be in a range of about 20 nm to 1200 nm, preferably in a range about 50 nm to 900 nm, and more preferably in a range of about 100 nm to 700 nm. The exemplary bilayer thickness may contain a layer of TiW or Ti in a range of about 100 to 200 nm, and a layer of Cu or Cu alloy in a range of about 20 nm to 700 nm. Material for the TSVs may be Cu or Cu—Al alloy. Material for the first and second insulating polymer may be polyimide (PI), photoresist, photosensitive polyimide (PSPI), epoxy, polybenzobisoxazole (PBO), bisbenzocyclobutene (BCB) or composites. The step of removing the first and the second temporary test structures may contain wet chemical etching, reactive ion etching, inert gas sputtering, or laser ablation. The step of thinning the grind side of the substrate may contain chemical mechanical polishing (CMP) process. The step of debonding the layer of the first carrier may contain irradiating the substrate with an excimer laser. The step of patterning the first electrical test layer, the step of patterning the second electrical test layer, or the steps of patterning both may contain: performing a laser ablation on the electrical test layer (the first or the second electrical test layer) using an excimer laser through an ablation mask, which contains an electrical testing pattern, to selectively remove portions of the electrical test layer; and removing loose material of the electrical test layer to form the temporary test structure (the first or the second temporary test structure) containing the electrical testing pattern. Alternatively, a lithographic process in combination with a RIE process may be used to pattern the electrical test layer or layers to form the temporary test structure or structures.

The second temporary test structure contains unremoved portions of the second electrical test layer and includes providing electrical connection between at least the first test location and the second test location, wherein the first and second test locations are each electrically connected to at least one of the TSVs. Besides one test location may connect to one other test location such as the first and second test locations, one test location which includes the first and second test locations may electrically connect to more than one test locations, and one test location which does not include the first and second test locations may not have electrical connection to other test locations. The test locations may be electrical test pads. The electrical test pads provide a method to make temporary connections to small TSV landings or features at extreme tight pitch to fan them out to testable pads sizes and pitches. The electrical test pads may be over the TSVs, may be away from the TSVs and may be in kerf area. The step of performing electrical testing by probing at least the first test location and the second test location on the second temporary test structure contains probing the temporary test structure with a probe. The probe may include a cobra probe, a membrane probe, and a cantilever probe. The preferable probe is a cobra probe.

BRIEF DESCRIPTION OF THE DRAWINGS

The present invention may best be understood from the following detailed description of preferred embodiments, taken in conjunction with the appended drawings, and in which:

FIG. 2 is a schematic cross-sectional diagram representing a substrate containing a plurality of electrically conductive interconnects and a layer of an insulating polymer covering the top surface of the substrate except surfaces of the electrically conductive interconnects according to one embodiment of the present invention;

FIG. 3, in which 3A is a schematic top-view diagram representing an electrical test layer being conformally formed on top of the substrate of FIG. 2, and 3B is a schematic cross-sectional diagram representing an electrical test layer being conformally formed on top of the substrate of FIG. 2 according to one embodiment of the present invention;

FIG. 9 is a schematic cross-sectional diagram representing probe pins probing the temporary test structure on the substrate of FIG. 7 according to one embodiment of the present invention;

FIG. 10 is a schematic cross-sectional diagram representing part of the temporary test structure on the substrate of FIG. 7 being removed according to one embodiment of the present invention;

FIG. 11 is a schematic cross-sectional diagram representing a substrate having a device side and a grind side, and containing a plurality of TSVs with a layer of a first insulating polymer covering the top surface of the device side except surfaces of the TSVs according to one embodiment of the present invention;

FIG. 12, in which 12A is a schematic top-view diagram representing a first electrical test layer being conformally formed on top of the substrate of FIG. 11, and 12B is a schematic cross-sectional diagram representing a first electrical test layer being conformally formed on top of the substrate of FIG. 11 according to one embodiment of the present invention;

FIG. 14 is a schematic cross-sectional diagram representing the substrate being flipped upside down after a layer of a first carrier being bonded to the top surface of the substrate of FIG. 13 with a layer of a first adhesive according to one embodiment of the present invention;

FIG. 15 is a schematic cross-sectional diagram representing the top surface of the grind side on the substrate of FIG. 14 being thinned to reveal the TSVs according to one embodiment of the present invention;

FIG. 18 is a schematic cross-sectional diagram representing probe pins probing the second temporary test structure on the substrate of FIG. 17 according to one embodiment of the present invention;

FIG. 19 is a schematic cross-sectional diagram representing the second temporary test structure on the substrate of FIG. 18 being completely removed according to one embodiment of the present invention;

FIG. 20 is a schematic cross-sectional diagram representing the substrate being flipped upside down after a layer of a second carrier being bonded to the top surface of the substrate of FIG. 19 with a layer of a second adhesive according to one embodiment of the present invention;

FIG. 21 is a schematic cross-sectional diagram representing the layer of the first carrier being debonded and the layer of the first adhesive being removed from the top surface of the device side of the substrate of FIG. 20 to reveal the first temporary test structure according to one embodiment of the present invention.

Figure 1:
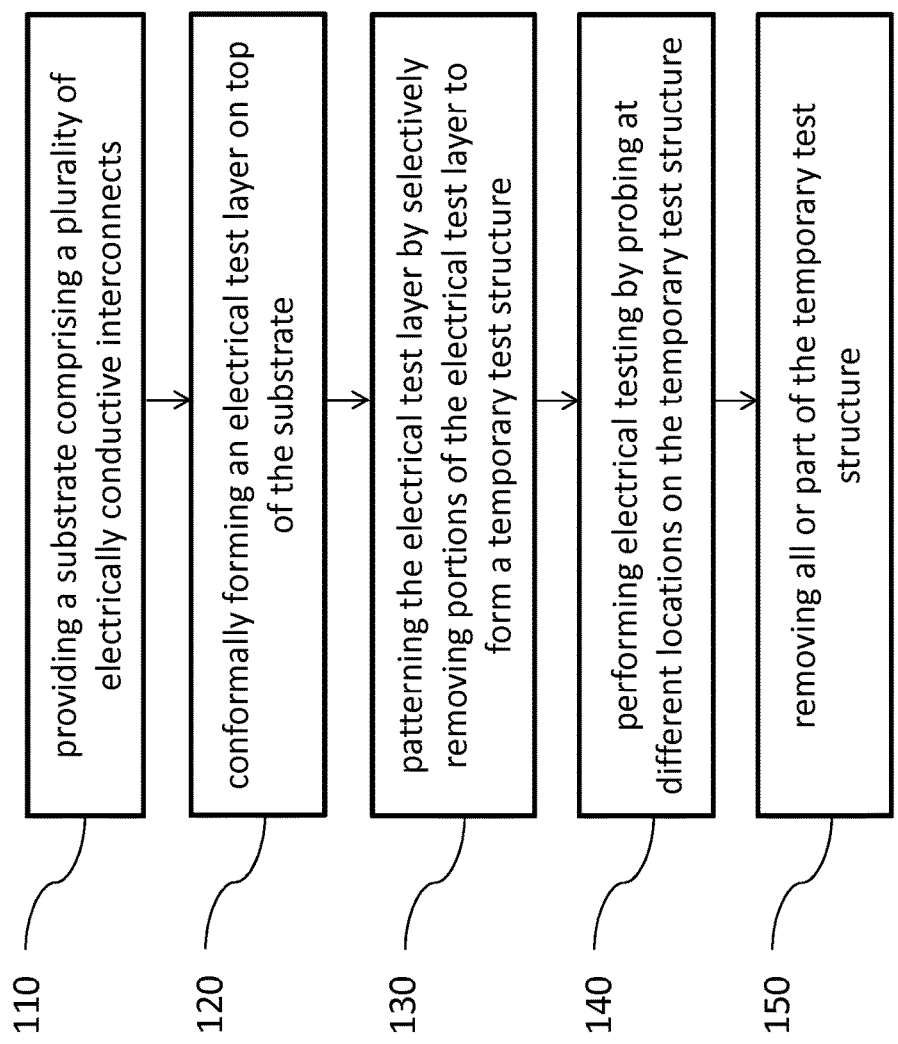
FIG. 1 is a flow chart of a method of forming a temporary test structure for device fabrication according to one embodiment of the present invention.

Since the drawings in FIGS. 2-22 are intended for illustrative purpose, the elements in the drawings are not necessarily drawn to scale. For example, some of the elements may be enlarged or exaggerated for clarity purpose.

DETAILED DESCRIPTION OF PREFERRED EMBODIMENTS

This invention relates generally to a method of forming a temporary test structure for device fabrication. Specifically, the method of the present invention is to form a temporary electrical test structure for testing conductive interconnects during C4 fabrication or for testing TSVs during interposer fabrication.

The exemplary embodiments now will be described more fully hereinafter in connection with the accompanying drawings. The present invention may be embodied in many different forms. The specific embodiments shown are merely illustrative of specific ways to make and use of the present invention, and do not limit the scope of the present invention.

One embodiment of the present invention includes a method of forming a temporary test structure for device fabrication. The method described in this embodiment may also be specifically useful to form a temporary electrical test structure for testing conductive interconnects during C4 fabrication. The method contains the following steps: providing a substrate containing a plurality of electrically conductive interconnects extending vertically to top surface of the substrate; conformally forming an electrical test layer on top of the substrate, the electrical test layer connecting to the plurality of electrically conductive interconnects; patterning the electrical test layer by selectively removing portions of the electrical test layer to form a temporary test structure which contains unremoved portions of the electrical test layer and includes providing electrical connection between at least a first test location and a second test location, wherein the first and second test locations are each electrically connected to at least one of the plurality of electrically conductive interconnects; performing electrical testing by probing at least the first test location and the second test location on the temporary test structure; and removing all or part of the temporary test structure. The method is illustrated in the flow chart of FIG. 1. The sequence of the steps as shown in the chart and described above is preferred. However, the invention is not limited to the performance of these steps with the sequence or order presented above. Many steps may also be applied to the substrate before, between or after the steps shown above. FIGS. 2-10 are demonstrative illustrations of cross-sectional views or top views of structures in the method of forming temporary test structure specifically for C4 fabrication of the embodiment of the present invention.

At block 110 of FIG. 1, a substrate containing a plurality of electrically conductive interconnects is provided. The provided substrate may be a dielectric substrate or a semiconductor substrate. The semiconductor substrate may be a silicon wafer, a silicon germanium wafer, a silicon on insulator (SOI) wafer, or any other commonly used semiconductor wafer. The substrate may contain silicon, silicon oxide, aluminum-aluminum oxide, gallium arsenide, ceramic, quartz, copper or any combination thereof, including multilayers. The substrate can include one or more semiconductor layers or structures and can include active or operable portions of semiconductor devices. Referring to FIG. 2, a substrate containing a dielectric layer 100, a plurality of electrically conductive interconnects 200, and an insulating polymer layer 300 is provided, within which the insulating polymer layer 300 is on top of the dielectric layer 100 and the plurality of electrically conductive interconnects 200 extend vertically through the dielectric layer 100 to the top surface of the substrate. Although the insulating polymer layer 300 is on top of the dielectric layer 100 as illustrated here, the method of the presentation invention would work regardless of what the insulating polymer layer 300 is on top of. The insulating polymer layer 300 may be included as portions of the electrical wiring system. The substrate may contain other components not shown in FIG. 2, such as multilayer of interconnect circuitry, active portions of semiconductor devices, and other multilayer structures. The dielectric layer 100 may contain tetraethyl orthosilicate (TEOS), silicon nitride, silicon oxide ($SiO_2$), nanopourous silica, hydrogensilsesquioxanes (HSQ), Teflon-AF (polytetrafluoethylene or PTFE), silicon oxyflouride (FSG), carbon doped $SiO_2$ (SiCO), or other low k dielectric materials. The preferable material for dielectric layer 100 is $SiO_2$ or SiCO. Material for the insulating polymer layer 300 may be polyimide (PI), photoresist, or photosensitive polyimide (PSPI), epoxy, polybenzobisoxazole (PBO), bisbenzocyclobutene (BCB) or composites. The preferable material for the insulating polymer layer 300 is PSPI. The plurality of electrically conductive interconnects 200 may contain a metal such as Al, Cu, Ti, or W, may contain a binary or ternary alloy, such as Cu—Al, Al—Pd—Cu, Al—Pd—Nb, or Al—Cu—Si, or may contain other similar low resistivity metals or metal alloys. The preferable material for the electrically conductive interconnects 200 may be Cu or Cu—Al alloy. The electrically conductive interconnects 200 may be any commonly known interconnect structures including conductive vias. For 3D IC, the conductive vias may be TSVs.

At block 120 of FIG. 1, an electrical test layer is conformally formed on top of the substrate. Referring to FIG. 3, in which 3A is a schematic top-view diagram representing an electrical test layer 400 being conformally formed on top of the substrate of FIG. 2, and 3B is a schematic cross-sectional diagram representing an electrical test layer 400 being conformally formed on top of the substrate of FIG. 2. Small step openings 400a above the electrical test layer 400 on top of the plurality of electrically conductive interconnects 200 are also shown in FIG. 3. The electrical test layer 400 provides electrical connections to all the electrically conductive interconnects 200. Material of the electrical test layer 400 may be Cu, Ti, W, Ta, Ru, Cr, Ir, Os, Pd, Pt, or alloys or ceramics thereof. The electrical test layer 400 may contain single layer or multilayer such as bilayer. The preferable single layer material is a seed layer material such as titanium tungsten alloy (Ti—W, or TiW). The preferable bilayer material is a layer of Cu or Cu alloy over a layer of Ti or TiW. It is also preferred to have a material which can be easily removed with laser ablation. Thickness of the electrical test layer 400 may be in a range of about 20 nm to 1200 nm, preferably in a range about 50 nm to 900 nm, and more preferably in a range of about 100 nm to 700 nm. The exemplary bilayer thickness may contain a layer of TiW or Ti in a range of about 100 to 200 nm, and a layer of Cu or Cu alloy in a range of about 20 nm to 700 nm. The advantage of using bilayer seed layer material for the electrical test layer 400 is that the layer of Ti or TiW can function as a barrier layer and the layer of Cu or Cu alloy as a conductive layer. The higher conductivity of Cu or Cu alloys may provide better electroplating and better electrical testing. The thickness of the electrical test layer 400 may be optimized between current carrying capability, ability to create consistent film, and ability to be removed using a laser pulse ablation. The electrical test layer 400 may be formed on the substrate with various deposition processes include, but are not limited to: physical vapor deposition (PVD), chemical vapor deposition (CVD), atomic layer deposition (ALD), electrochemical deposition (ECD), electroplating, electroless plating and spin coating. The preferable method is PVD, such as sputtering.

Figure 4:
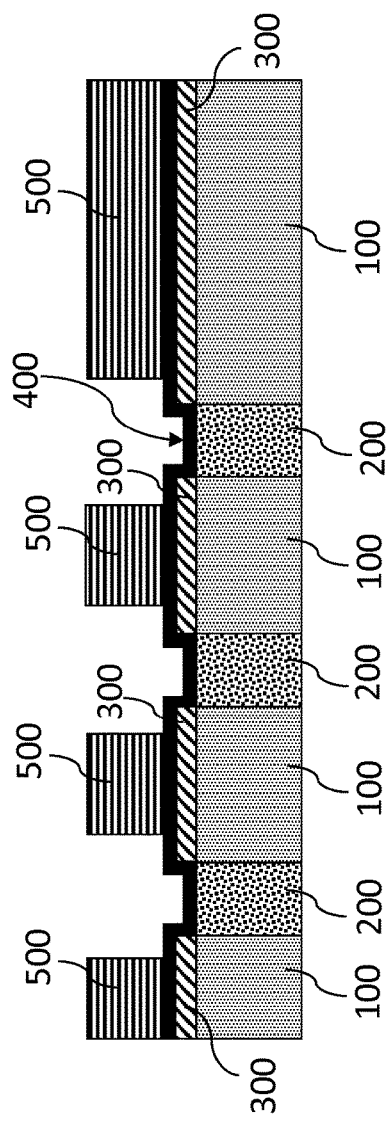
FIG. 4 is a schematic cross-sectional diagram representing a patterned photoresist layer being formed over the electrical test layer on top of the substrate of FIG. 3 according to one embodiment of the present invention.
Figure 5:
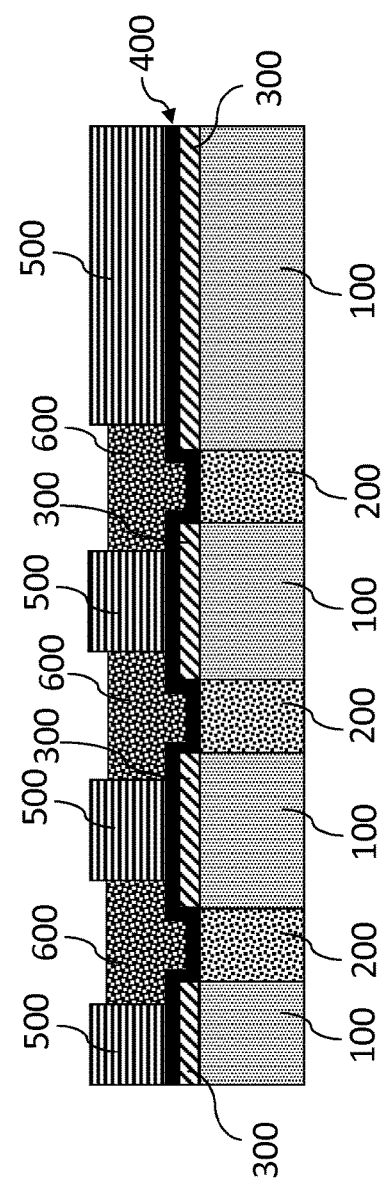
FIG. 5 is a schematic cross-sectional diagram representing C4 bumps being formed over the plurality of electrically conductive interconnects with a pattern defined by the patterned photoresist layer of FIG. 4 according to one embodiment of the present invention.
Figure 6:
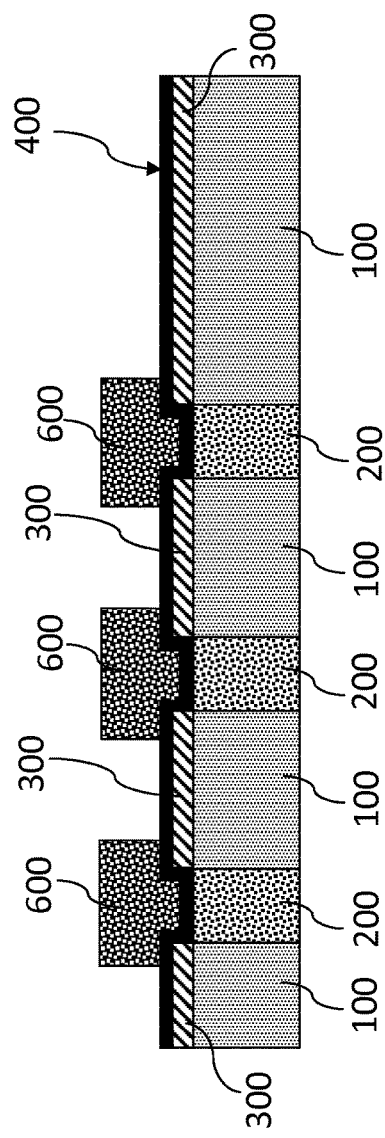
FIG. 6 is a schematic cross-sectional diagram representing the patterned photoresist layer on the substrate of FIG. 5 being removed according to one embodiment of the present invention.

FIG. 4 is a schematic cross-sectional diagram representing a patterned photoresist layer 500 being formed over the electrical test layer 400 on top of the substrate of FIG. 3. The formation of the patterned photoresist layer 500 may be obtained through a conventional lithographic process. An un-patterned photoresist layer is usually formed on the substrate through a process including a spin coating step and a baking step. The photoresist may be a chemically amplified photoresist or a non-chemically amplified photoresist. The photoresist may also be either positive tone or negative tone. The un-patterned photoresist layer coated over the electrical test layer 400, is first exposed with a radiation through a photomask, and is then processed with a typical photoresist process, such as baking and then developing with a developer, to form the patterned photoresist layer 500. The radiation may be short wavelength UV lights such as 436 nm, 365 nm, 248 nm, 193 and 157 nm, extremely small wavelengths such as EUV (extreme ultraviolet), or non-optical system such as E-beam or ion-beam. FIG. 5 is a schematic cross-sectional diagram representing C4 bumps 600 being formed over the plurality of electrically conductive interconnects 200 with a pattern defined by the patterned photoresist layer 500 of FIG. 4. The C4 bumps 600 may be formed of any suitable conductive material, including Cu, Ni, Pt, Al, a solder material (e.g., SnPb, a high-Pb material, a Sn-based solder, a lead-free solder), combinations thereof, or the like, and may be formed through any number of suitable techniques, including PVD, CVD, ECD, ALD, molecular beam epitaxy (MBE), electroplating, electroless plating and the like. The preferable method is electroplating or electroless plating. For electroplating, the C4 bumps 600 are formed by plating in galvanostatic mode in a plating bath using the electrical test layer 400 which is deposited on the face of the integrated circuit chip containing the plurality of electrically conductive interconnects 200. The electrical test layer 400 provides good electrical contact, so that uniform size C4 bumps 600 can be electroplated above the plurality of electrically conductive interconnects 200 as shown in FIG. 5. FIG. 6 is a schematic cross-sectional diagram representing the patterned photoresist layer 500 on the substrate of FIG. 5 being removed to reveal the C4 bumps 600 on the electrical test layer 400 over the plurality of electrically conductive interconnects 200.

The patterned photoresist layer 500 may be stripped with a photoresist stripper. Many known photoresist strippers can be used, for example DuPont™ EKC162™ resist remover for wafer level packaging (WLP) which is an aqueous organic mixture, formulated to effectively remove thick photoresist used in wafer bumping and WLP. Alternatively, the stripping process may apply many known dry etch processes to the substrate, such as applying oxygen plasma etching followed with pressure DI water rinse.

Figure 7:
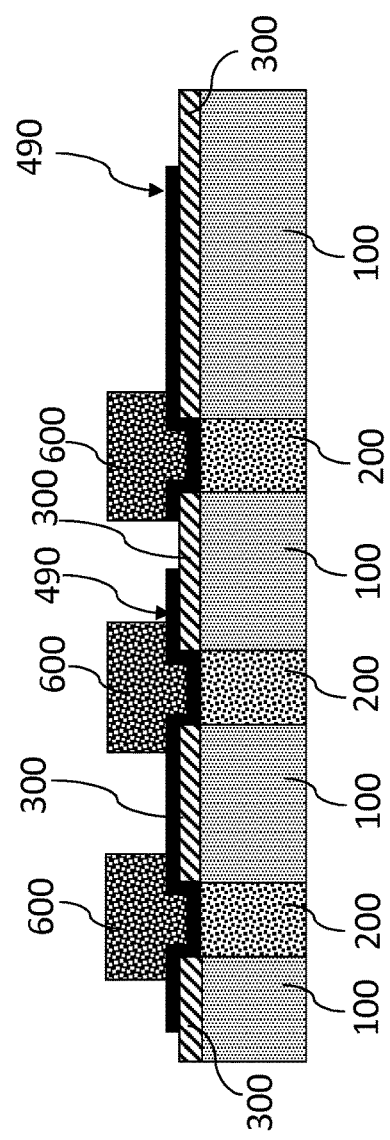
FIG. 7 is a schematic cross-sectional diagram representing portions of the electrical test layer on the substrate of FIG. 6 being selectively removed to form a temporary test structure according to one embodiment of the present invention.
Figure 8:
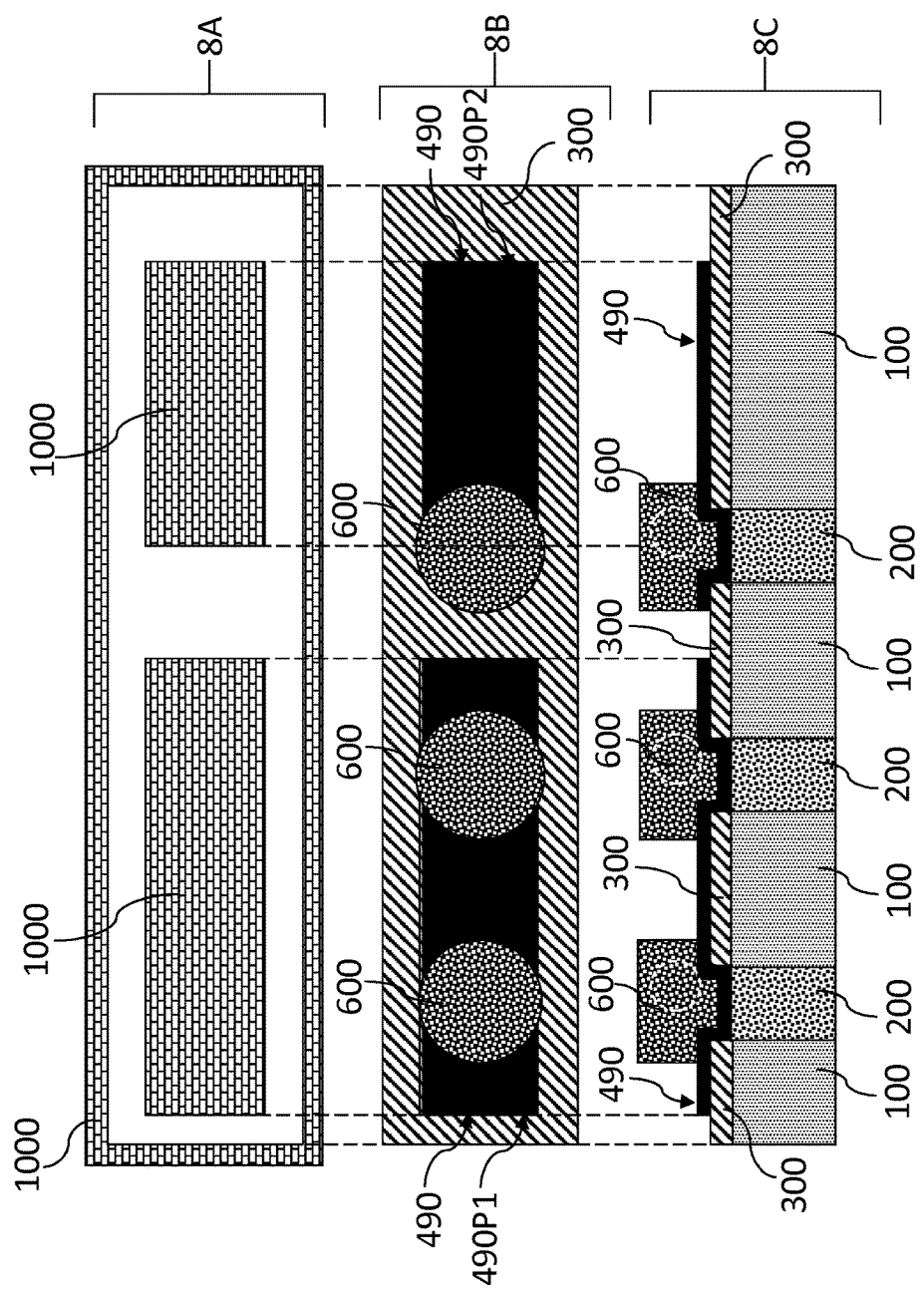
FIG. 8, in which 8A is a schematic top-view diagram representing an ablation mask, 8B is a schematic top-view diagram representing portions of the electrical test layer on the substrate of FIG. 6 being selectively removed to form a temporary test structure, and 8C is a schematic cross-sectional diagram representing portions of the electrical test layer on the substrate of FIG. 6 being selectively removed to form a temporary test structure according to one embodiment of the present invention.

At block 130 of FIG. 1, the electrical test layer is patterned by selectively removing portions of the electrical test layer to form a temporary test structure which contains the un-removed electrical test layer. Correspondingly, FIG. 7 is a schematic cross-sectional diagram representing portions of the electrical test layer 400 on the substrate of FIG. 6 being selectively removed to form a temporary test structure 490. Referring to FIG. 8, in which 8A is a schematic top-view diagram representing an ablation mask 1000, 8B is a schematic top-view diagram representing portions of the electrical test layer 400 on the substrate of FIG. 6 being selectively removed to form a temporary test structure 490, and 8C is a corresponding cross-sectional diagram of 8B. In the process of removing portions of the electrical test layer 400, excimer laser light irradiates through the ablation mask 1000 and reaches the top surface of the substrate to ablate away the irradiated portion of the electrical test layer 400. The excimer laser light blocked by the ablation mask 1000 does not reach the surface of the substrate, and those portions of the electrical test layer 400 remain on the surface of the substrate to form the temporary test structure 490. The ablation mask 1000 contains an electrical test pattern which is then transferred to the temporary test structure 490. The electrical test pattern contains a pattern of electrical test pads and many other necessary electrical connections for electrical testing. After ablation, the surface may contain loose material of the electrical test layer, thus a pressure water rinse may be applied to the surface of the substrate to remove the loose material to obtain clean temporary test structure 490 on the substrate, wherein the temporary test structure 490 contains the electrical test pattern. For laser ablative work, ultraviolet, visible and near-infrared lasers can be used with laser radiation in the wavelength range of 200-1,000 nm. Infrared laser has deeper penetration to the substrate and may also generate extra undesired heat, so it may only be used with caution. It is preferable to use excimer laser with proper pulse length for the present invention, typically on the order of 10 ns with an applied fluence from 0.1 to 1 joule per square centimeter. Alternatively to the laser ablation, a lithographic process in combination with RIE process may be used to pattern the electrical test layer 400 to form the temporary test structure 490. A photoresist layer is formed on the substrate through a process including a spin coating step and a baking step. Either positive or negative photoresist may be used. The photoresist layer is first exposed with a radiation through a photomask which contains an electrical test pattern, and is then processed with a typical photoresist process, such as baking and then developing with a developer, to form a patterned photoresist layer. RIE is carried out with photoresist as etch mask to remove portions of the electrical test layer 400 to form the temporary test structure 490. Proper etchant may be chosen for the RIE process, for example an etchant with a mixture of sulfur hexafluoride ($SF_6$), boron trichloride ($BCl_3$), chlorine ($Cl_2$), carbon tetrafluoride ($CF_4$) and nitrogen ($N_2$) may be used for etching TiW, and a mixture of boron trichloride ($BCl_3$), chlorine ($Cl_2$), and nitrogen ($N_2$) may be used for Cu. Instead of RIE, chemical etching may be used, for example hydrogen peroxide ($H_2O_2$) alone or a solution of ethylenediaminetetraacetic acid (EDTA), $H_2O_2$, and ammonium hydroxide ($NH_4OH$) may be used to etch TiW. Acidic wet Cu etch may include: a nitric acid etch or acidic mixtures etch containing an oxidizing agent, such as hydrogen peroxide, permanganate, ferric ion, bromine, and chromium (VI) and an acid (e.g., acetic or sulfuric). Neutral and alkaline Cu etches may include: ammonium or alkali metal persulfate solutions, ferric chloride based solutions, and ammonium hydroxide based solutions. After etching, the photoresist may be stripped with commonly known photoresist strip process. The radiation may be short wavelength UV lights such as 436 nm, 365 nm, 248 nm, 193 and 157 nm, extremely small wavelengths such as EUV (extreme ultraviolet), or non-optical system such as E-beam or ion-beam.

The temporary test structure 490 contains unremoved portions of the electrical test layer and includes providing electrical connection between at least the first test location and the second test location, wherein the first and second test locations are each electrically connected to at least one of the electrically conductive interconnects 200. A test location is a place that a testing equipment interacts with a tested substrate, for example a place on the temporary test structure 490 which a probe pin of a probe contacts the temporary test structure 490. Besides one test location may connect to one other test location such as the first and second test locations, one test location which includes the first and second test locations may electrically connect to more than one test locations, and one test location which does not include the first and second test locations may not have electrical connection to other test location. The test locations of the temporary test structure 490 may be electrical test pads. The electrical test pads provide a way to make temporary connections to small interconnect landings or features at extreme tight pitch to fan them out to testable pads sizes and pitches. For example, as shown in 8B of FIG. 8, the structure area 490P1 and structure area 490P2 of the temporary test structure 490 except areas covered by C4 bumps 600 can be used as electrical test pads and electrical connections. Each of these two structure areas can provide one or more test locations. In many instances, the structure areas 490P1 and 490P2 may only be used as electrical connections, and a different electrical test patent of the temporary test structure 490 including the extension of these structure areas to large square shape areas as electrical test pads has to be used. The electrical test pads may be away from the electrical conductive interconnects 200 and may be in the kerf area. Kerf area is the space between chips. Chip area is the space within the chip. Many temporary special electrical test features, electrical test pads, and power connections may be added to the temporary test structure 490 at previously untestable product levels and now testable. These temporary special features, pads and connections may provide fan out access to fine pitch structures during test. Many temporary connections in the temporary test structure 490 may provide temporary test connections on critical product paths that permanent connections would not be allowed due to effects on product performance. The electrical test pattern is designed on the ablation mask or photomask to contain all these special features, pads, and connections, and is transferred to the pattern of the temporary test structure 490. The electrical test pads may increase to an effective size for probe testing. For example, the electrical test pads may be made to have pitches >150 μm and pad sizes >25 μm to meet the current limitations of state of art probes. The electrical test pads with proper thickness may also improve mechanic compliance for electrical testing. In other words, the electrical test pads may prevent probe damage to the underlying structures of the substrate.

At block 140 of FIG. 1, electrical testing is performed by probing at different locations which include the first and second test locations on the temporary test structure. The step of performing electrical testing contains probing the temporary test structure with a probe containing probe pins. FIG. 9 is a schematic cross-sectional diagram representing probe pins A, B, and C, probing the temporary test structure 490 on the substrate of FIG. 7. Probe pins A, B and C are representative. A probe may contain hundreds of probe pins. The first and second test locations may be represented by the test locations probed by any two of these three probe pins A, B and C as long as these two test locations under these two chosen probe pins are electrically connected. The test locations under probes A and B is clearly electrically connected through the temporary test structure 490 itself. Whether the test locations under probes A and C or B and C are electrically connected depends on the circuitry in the substrate. The probing contains a procedure: a plurality of probe pins (such as A, B, and C) electrically contact the test locations (which are usually electrical test pads) of the temporary test structure 490 for providing test signals and collecting test results, and a computer-based control system of a test probe (such as a cobra probe) controls the test procedure and analyzes the test results. Since different IC may have different I/Os and power layouts, probe cards are suitable for probing. A probe card typically includes a plurality of probe pins arranged in a certain style. Probe pins are served as input or output channels for signals. Cobra probe cards, membrane probe cards, and cantilever probe cards are among the most commonly used probe cards. Cobra cards have array-type pins, and are preferable for the present invention. As shown in FIG. 9 the probe pins A, B and C, (such as probe pins of a cobra probe) land on the temporary test structure 490 not on the plurality of the electrically conductive interconnects 200 or C4 bumps 600, thus any probing damage is limited to just the temporary test structure 490 so as not to affect the process or the final device performance.

At block 150 of FIG. 1, all or part of the temporary test structure is removed. Correspondingly, FIG. 10 is a schematic cross-sectional diagram representing part of the temporary test structure 490 on the substrate of FIG. 7 being removed. The remaining temporary test structure 490r under the C4 bumps 600 becomes part of the C4 structure and function as part of the electrical circuit. Besides the remaining temporary test structure 490r, other part of the temporary test structure 490 may be intentionally kept in place for later diagnostic testing or reduce processing time. Removing part of the temporary test structure 490 may be at least removing more than 50% of the temporary test structure 490, or at least removing more than 65% of the temporary test structure 490. In the C4 fabrication process, if the electrical testing is carried out before plating C4 bumps 600, all of the temporary test structure 490 may be removed. The removing method may contain wet chemical etching, RIE, inert gas sputtering, or laser ablation. Excimer laser ablation with an ablation mask may be used to selectively remove portions of the temporary test structure 490 to keep some features in place for later diagnostic testing. Proper etchant may be chosen for the RIE process, for example an etchant with a mixture of sulfur hexafluoride ($SF_6$), boron trichloride ($BCl_3$), chlorine ($Cl_2$), carbon tetrafluoride ($CF_4$) and nitrogen ($N_2$) may be used for etching TiW, and a mixture of boron trichloride ($BCl_3$), chlorine ($Cl_2$), and nitrogen ($N_2$) may be used for Cu. Instead of RIE, chemical etching may be used, for example hydrogen peroxide ($H_2O_2$) alone or a solution of ethylenediaminetetraacetic acid (EDTA), $H_2O_2$, and ammonium hydroxide ($NH_4OH$) may be used to etch TiW. Acidic wet Cu etch may include: a nitric acid etch or acidic mixtures etch containing an oxidizing agent, such as hydrogen peroxide, permanganate, ferric ion, bromine, and chromium (VI) and an acid (e.g., acetic or sulfuric). Neutral and alkaline Cu etches may include: ammonium or alkali metal persulfate solutions, ferric chloride based solutions, and ammonium hydroxide based solutions. After removing all or part of the temporary test structure 490, the substrate of FIG. 10 may be continually processed with a next normal processing step.

Another embodiment of the present invention includes a method of forming a temporary test structure for device fabrication, especially for testing TSVs during interposer fabrication. The method contains the following steps: providing a substrate having a device side and a grind side, and containing a plurality of TSVs extending vertically to top surface of the device side with a layer of a first insulating polymer covering the top surface except surfaces of the plurality of TSVs; conformally forming a first electrical test layer on the top surface of the device side, the first electrical test layer connecting to the plurality of TSVs; patterning the first electrical test layer by selectively removing portions of the first electrical test layer to form a first temporary test structure which contains unremoved portions of the first electrical test layer; applying a layer of a first adhesive over the top surface of the device side of the substrate, bonding a layer of a first carrier on top using the layer of the first adhesive, and flipping the substrate upside down; thinning the grind side of the substrate to reveal the plurality of TSVs; forming a layer of a second insulating polymer on top surface of the grind side with an insulating-layer pattern not covering surfaces of the TSVs; conformally forming a second electrical test layer on the top surface of the grind side, the second electrical test layer connecting to the plurality of TSVs; patterning the second electrical test layer by selectively removing portions of the second electrical test layer to form a second temporary test structure which contains unremoved portions of the second electrical test layer and includes providing electrical connection between at least a first test location and a second test location, wherein the first and second test locations are each electrically connected to at least one of the plurality of TSVs; performing electrical testing by probing at least the first test location and the second test location on the second temporary test structure; removing the second temporary test structure; applying a layer of a second adhesive over the top surface of the grind side of the substrate, bonding a layer of a second carrier on top using the layer of the second adhesive, and flipping the substrate upside down; debonding the layer of the first carrier and removing the layer of the first adhesive to reveal the first temporary test structure; and removing the first temporary test structure. The sequence of the steps as described above is preferred. However, the invention is not limited to the performance of these steps with the sequence or order presented above. Many steps may also be applied to the substrate before, between or after the steps shown above. FIGS. 11-22 are demonstrative illustrations of cross-sectional views or top views of structures in the method of forming a temporary test structure for testing TSVs during interposer fabrication of the embodiment of the present invention.

Referring to FIG. 11, a substrate having a device side D01 and a grind side G02, and containing a dielectric layer 101, a plurality of TSVs 201, and a first insulating polymer layer 301 is provided. Within the substrate, the first insulating polymer layer 301 is on top of the dielectric layer 101 covering the top surface of the substrate except the surfaces of the plurality of TSVs 201, and the plurality of TSVs 201 extend vertically through the dielectric layer 101 to the top surface of the device side D01 of the substrate. The device side D01 of the substrate is on the top and the grind side G02 is on the bottom in FIG. 11. The provided substrate may be a dielectric substrate or a semiconductor substrate. The semiconductor substrate may be a silicon wafer, a silicon germanium wafer, a silicon on insulator (SOI) wafer, or any other commonly used semiconductor wafer. The substrate may contain silicon, silicon oxide, aluminum-aluminum oxide, gallium arsenide, ceramic, quartz, copper or any combination thereof, including multilayers. The substrate may include one or more semiconductor layers or structures and may include active or operable portions of semiconductor devices. The active or operable portions of semiconductor devices are mainly on the device side D01 of the substrate. C4s or other complex structures can be fabricated on the grind side G02 while using the method of the present invention. There may be one or more layers of wiring between the TSVs 201 and the layer being worked on. This applies to both sides (the device side D01 and the grind side G02) of the substrate. The dielectric layer 101 may contain tetraethyl orthosilicate (TEOS), silicon nitride, silicon oxide ($SiO_2$), nanopourous silica, hydrogensilsesquioxanes (HSQ), Teflon-AF (polytetrafluoethylene or PTFE), silicon oxyflouride (FSG), carbon doped $SiO_2$ (SiCO), or other low k dielectric materials. The preferable material for dielectric layer 101 is $SiO_2$ or SiCO. Material for the first insulating polymer layer 301 may be polyimide (PI), photoresist, or photosensitive polyimide (PSPI), epoxy, polybenzobisoxazole (PBO), bisbenzocyclobutene (BCB) and composites. Material for the first and second insulating polymer may be polyimide (PI), photoresist, or photosensitive polyimide (PSPI), epoxy, polybenzobisoxazole (PBO), bisbenzocyclobutene (BCB) or composites. The preferable material for the first insulating polymer layer 301 is PSPI. The plurality of TSVs 201 may contain a metal such as Al, Cu, Ti, or W, may contain a binary or ternary alloy, such as Cu—Al, Al—Pd—Cu, Al—Pd—Nb, or Al—Cu—Si, or may contain other similar low resistivity metals or metal alloys. The preferable material for the TSVs 201 may be Cu or Cu—Al alloy.

Referring to FIG. 12, in which 12A is a schematic top-view diagram representing a first electrical test layer 401 being conformally formed on top of the substrate of FIGS. 11, and 12B is a corresponding schematic cross-sectional diagram of 12A. The first electrical test layer 401 is on the top surface of the device side D01, and connects to the plurality of TSVs 201. Small step openings 401a above the first electrical test layer 401 on top of the plurality of TSVs 200 are also shown in FIG. 3. The electrical test layer 401 provides electrical connections to all the TSVs 201. Material of the first electrical test layer 401 may be Ru, Cr, Ta, Ir, Os, Ti, W, Pd, Pt, Cu or alloys thereof. The first electrical test layer 401 may contain single layer or multilayer such as bilayer. The preferable single layer material is a seed layer material, such as titanium tungsten alloy (Ti—W, TiW). The preferable bilayer material is a layer of Cu or Cu alloy over a layer of Ti or TiW. It is also preferred to have a material which can be easily removed with laser ablation. Thickness of the first electrical test layer 401 may be in a range of about 20 nm to 1200 nm, preferably in a range about 50 nm to 900 nm, and more preferably in a range of about 100 nm to 700 nm. The exemplary bilayer thickness may contain a layer of TiW or Ti in a range of about 100 to 200 nm, and a layer of Cu or Cu alloy in a range of about 20 nm to 700 nm. The advantage of using bilayer seed layer material for the first electrical test layer 401 is that the layer of Ti or TiW can function as a barrier layer and the layer of Cu or Cu alloy as a conductive layer. The higher conductivity of Cu or Cu alloys may provide better electroplating and better electrical testing. The thickness of the first electrical test layer 401 may be optimized between current carrying capability, ability to create consistent film, and ability to be removed using a laser pulse ablation. The first electrical test layer 401 may be formed on the substrate with various deposition processes include, but are not limited to: physical vapor deposition (PVD), chemical vapor deposition (CVD), atomic layer deposition (ALD), electrochemical deposition (ECD), electroplating, electroless plating and spin coating. The preferable method is PVD, such as sputtering.

Figure 13:
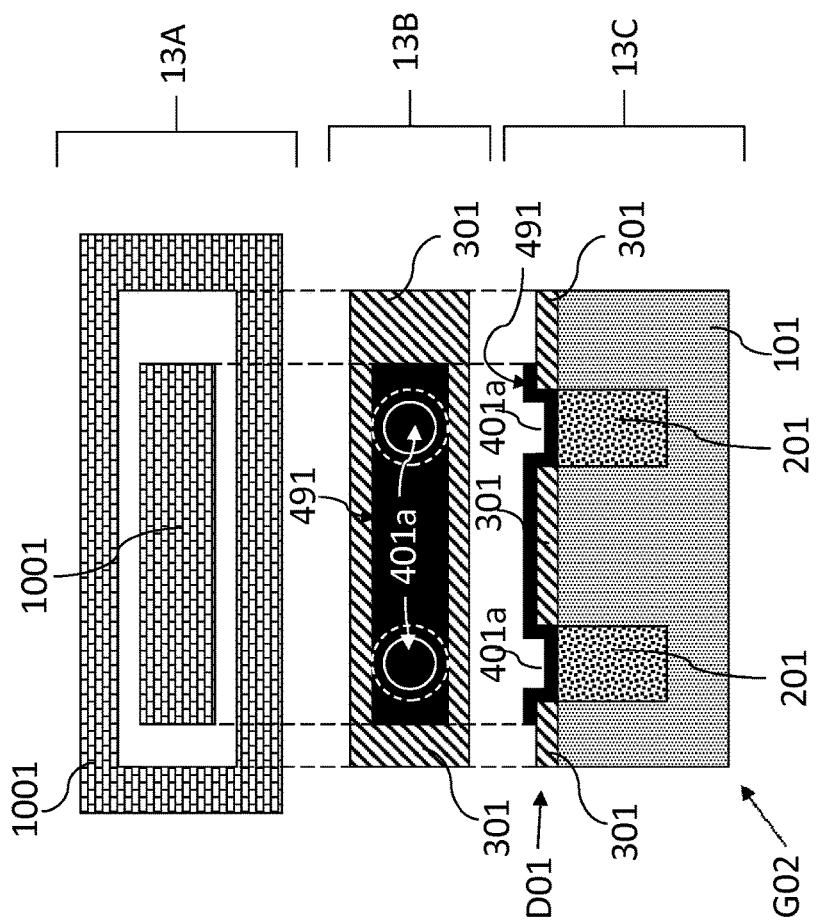
FIG. 13, in which 13A is a schematic top-view diagram representing an ablation mask, 13B is a schematic top-view diagram representing portions of the first electrical test layer on the substrate of FIG. 12 being selectively removed to form a first temporary test structure, and 13C is a schematic cross-sectional diagram representing portions of the first electrical test layer on the substrate of FIG. 12 being selectively removed to form a first temporary test structure according to one embodiment of the present invention.

Referring to FIG. 13, in which 13A is a schematic top-view diagram representing an ablation mask 1001, 13B is a schematic top-view diagram representing patterning the first electrical test layer 401 by selectively removing portions of the first electrical test layer 401 on the substrate of FIG. 12 to form a first temporary test structure 491 which contains unremoved portions of the first electrical test layer 401, and 13C is a corresponding schematic cross-sectional diagram of 13B. In the process of removing portions of the first electrical test layer 401, excimer laser light irradiates through the ablation mask 1001 and reaches the top surface of the substrate to ablate away the irradiated portion of the first electrical test layer 401. The excimer laser light blocked by the ablation mask 1001 does not reach the surface of the substrate, and those portions of the first electrical test layer 401 remain on the surface of the substrate to form the first temporary test structure 491. The ablation mask 1001 contains a first electrical test pattern which is then transferred to the first temporary test structure 491. The first electrical test pattern contains a pattern of features of many necessary electrical connections for electrical testing. After ablation, the surface may contain loose material of the first electrical test layer 401, thus a pressure water rinse is applied to the surface of the substrate to remove the loose material to obtain clean first temporary test structure 491 on the substrate. For laser ablative work, ultraviolet, visible and near-infrared lasers can be used with laser radiation in the wavelength range of 200-1,000 nm. Infrared laser has deeper penetration to the substrate and may also generate extra undesired heat, so it may only be used with caution. It is preferable to use excimer laser with proper pulse length for the present invention, typically on the order of 10 ns with an applied fluence from 0.1 to 1 joule per square centimeter. Alternatively to the laser ablation, a lithographic process in combination with a RIE process may be used to pattern the first electrical test layer 401 to form the first temporary test structure 491. A photoresist layer is formed on the substrate through a process including a spin coating step and a baking step. Either positive or negative photoresist may be used. The photoresist layer is first exposed with a radiation through a photomask which contains a first electrical test pattern, and is then processed with a typical photoresist process, such as baking and then developing with a developer, to form a patterned photoresist layer. RIE is carried out with photoresist as etch mask to remove portions of the first electrical test layer 401 to form the first temporary test structure 491. Proper etchant may be chosen for the RIE process, for example an etchant with a mixture of sulfur hexafluoride ($SF_6$), boron trichloride ($BCl_3$), chlorine ($Cl_2$), carbon tetrafluoride ($CF_4$) and nitrogen ($N_2$) may be used for etching TiW, and a mixture of boron trichloride ($BCl_3$), chlorine ($Cl_2$), and nitrogen ($N_2$) may be used for Cu. Instead of RIE, chemical etching may be used, for example hydrogen peroxide ($H_2O_2$) alone or a solution of ethylenediaminetetraacetic acid (EDTA), $H_2O_2$, and ammonium hydroxide ($NH_4OH$) may be used to etch TiW. Acidic wet Cu etch may include: a nitric acid etch or acidic mixtures etch containing an oxidizing agent, such as hydrogen peroxide, permanganate, ferric ion, bromine, and chromium (VI) and an acid (e.g., acetic or sulfuric). Neutral and alkaline Cu etches may include: ammonium or alkali metal persulfate solutions, ferric chloride based solutions, and ammonium hydroxide based solutions. After etching, the photoresist may be stripped with commonly known photoresist strip process. The radiation may be short wavelength UV lights such as 436 nm, 365 nm, 248 nm, 193 and 157 nm, extremely small wavelengths such as EUV (extreme ultraviolet), or non-optical system such as E-beam or ion-beam.

After forming the first temporary test structure 491, a layer of a first adhesive is applied over the top surface of the device side D01 of the substrate, a layer of a first carrier is bonded on top using the layer of the first adhesive, and the substrate is flipped upside down. The first carrier may be a glass carrier, a silicon carrier or any other suitable carrier. FIG. 14 is a schematic cross-sectional diagram representing the substrate being flipped upside down to show the grind side G02 on top after the layer of the first carrier 601 being bonded to the top surface of the substrate of FIG. 13 with the layer of the first adhesive 501. Material for the first adhesive 501 may require tolerance to back side grinding, dry etching, wet etching, CMP, lithographic processing, PVD, CVD, electroplating and polymer curing type processes. Many state of art materials may be suitably used for the embodiment of the present invention. One of the preferable materials is HD3007 which is a polyimide material available from HD Microsystems. The HD3007 material is a solution of a polyamic acid in butyrolactone/PGMEA. The cure condition is 250° C.-300° C. for 60 min. The layer of the first carrier 601 may be bonded to the substrate with a state of art bonding equipment by properly controlling bond temperature, bond pressure and bond time. After flipping the substrate, the grind side G02 on top of the substrate is thinned to reveal the plurality of the TSVs 201. FIG. 15 is a schematic cross-sectional diagram representing the top surface of the grind side G02 on the substrate of FIG. 14 being thinned to reveal the TSVs 201. The thinning process requires to ensure no backside contamination, uniform thinning depth, and evenly revealing TSVs 201. The thinning process may include disco grinding, dry etching, wet etching, CMP and their combinations thereof. The preferable thinning process is to include a CMP process.

Figure 16:
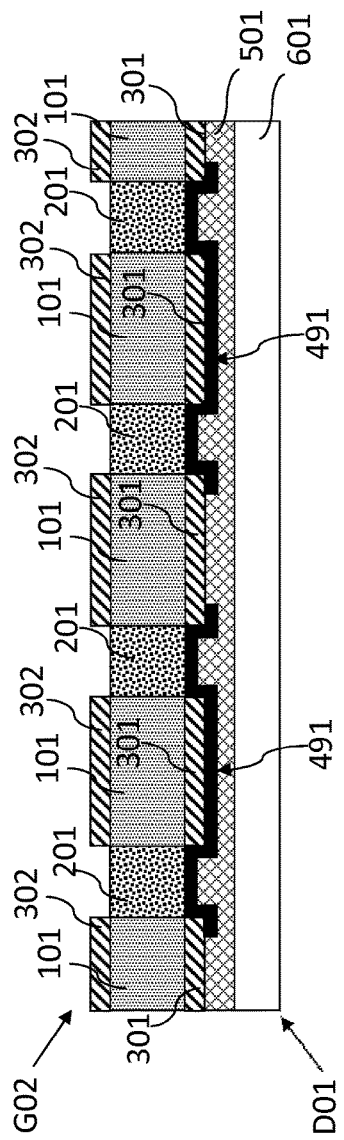
FIG. 16 is a schematic cross-sectional diagram representing a second insulating polymer being formed on the top surface of the grind side of the substrate of FIG. 15 with an insulating-layer pattern not covering surfaces of the TSVs according to one embodiment of the present invention.

FIG. 16 is a schematic cross-sectional diagram representing a layer of a second insulating polymer 302 being formed on the top surface of the grind side G02 of the substrate of FIG. 15 with an insulating-layer pattern not covering surfaces of the TSVs 201. Material for the layer of second insulating polymer 302 may be polyimide (PI), photoresist, or photosensitive polyimide (PSPI), epoxy, polybenzobisoxazole (PBO), bisbenzocyclobutene (BCB) or composites. The preferable material for the layer of second insulating polymer 302 is PSPI. PSPI can be formed on the top surface of the substrate with commonly known lithographic process to form the insulating-layer pattern not covering the TSVs 201. If polyimides or other non-photosensitive insulating polymers are used, a photoresist with a lithographic process in combination with an etch process is required to form the layer of the second insulating polymer 302 on top of the substrate.

Figure 17:
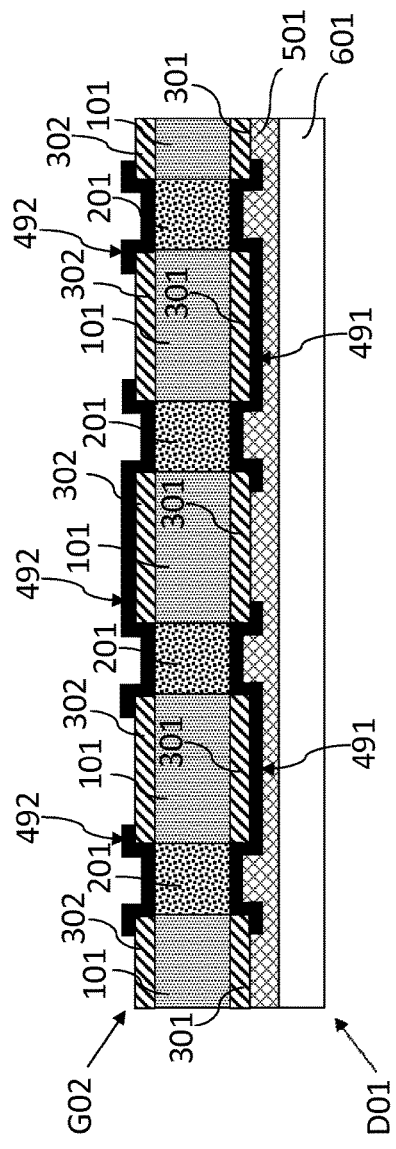
FIG. 17 is a schematic cross-sectional diagram representing a second electrical test layer being conformally formed and being selectively removed to form a second temporary test structure on top of the substrate of FIG. 16 according to one embodiment of the present invention.

After forming the layer of the second insulating polymer 302, a second electrical test layer is formed on the top surface of the grind side G02, the second electrical test layer connecting to the plurality of TSVs 201. Portions of the second electrically test layer are selectively removed to form a second temporary test structure which contains unremoved portions of the second electrical test layer and includes providing electrical connection between a first test location and a second test location, wherein the first and second test locations are each electrically connected to at least one of the TSVs 201. FIG. 17 is a schematic cross-sectional diagram representing a second electrical test layer being conformally formed and being selectively removed to form the second temporary test structure 492 on top of the substrate of FIG. 16. The material and process for forming the second temporary test structure 492 may be the same or different from those for the first temporary test structure 491. The pattern of the first temporary test structure 491 and the pattern of the second temporary test structure 492 are designed to ensure at least some electrical continuity between these two structures during electrical testing. The second temporary test structure 492 contains unremoved portions of the second electrical test layer and includes providing electrical connection between the first test location and the second test location, wherein the first and second test locations are each electrically connected to at least one of the TSVs 201. A test location is a place that a testing equipment interacts with a tested substrate, for example a place on the second temporary test structure 492 which a probe pin of a probe contacts the second temporary test structure 492. Besides one test location may connect to one other test location such as the first and second test locations, one test location which includes the first and second test locations may electrically connect to more than one test locations, and one test location which does not include the first and second test locations may not have electrical connection to other test location. The test locations of the second temporary test structure 492 may be electrical test pads. The electrical test pads provide a way to make temporary connections to small interconnect landings or features at extreme tight pitch to fan them out to testable pads sizes and pitches. The electrical test pads may be over the TSVs 201, may be away from the TSVs 201 and may be in a kerf area. Kerf area is the space between chips. Chip area is the space within the chip. Many temporary special electrical test features, electrical test pads, and power connections may be added to the second temporary test structure 492 at previously untestable product levels and now testable. These temporary special features, pads and connections may provide fan out access to fin pitch structures during test. Many temporary connections in the second temporary test structure 492 may provide temporary test connections on critical product paths that permanent connections would not be allowed due to effects on product performance. In the process of forming the second temporary test structure 492, the second electrical test pattern on the ablation mask or photomask is designed to contain all these special features, pads, and connections, and is transferred to the pattern of the second temporary test structure 492. The electrical test pads may increase to an effective size for probe testing. For example, the electrical test pads may be made to have pitches >150 µm and pad sizes >25 µm to meet the current limitations of available probes. The electrical test pads with proper thickness may also improve mechanic compliance for electrical testing. In other words, the electrical test pads may prevent probe damage to the underlying structures of the substrate.

After forming the second temporary test structure 492, an electrical testing is performed by probing at least the first test location and the second test location on the second temporary test structure 492. The step of performing electrical testing contains probing the second temporary test structure 492 with a probe containing probe pins. FIG. 18 is a schematic cross-sectional diagram representing probe pins, such as D and E, probing the second temporary test structure 492 on the substrate of FIG. 17. Probe pins D and E are representative. A probe may contain hundreds of probe pins. The first and second test locations may be represented by the test locations probed by these two probe pins D and E. The probing contains a procedure: a plurality of probe pins (such as D and E) electrically contact the test locations (which are usually electrical test pads) of the second temporary test structure 492 for providing test signals and collecting test results, and a computer-based control system of a test probe (such as a cobra probe) controls the test procedure and analyzes the test results. Since different IC may have different I/Os and power layouts, probe cards are suitable for probing. A probe card typically includes a plurality of probe pins arranged in a certain style. Probe pins are served as input or output channels for signals. Cobra probe cards, membrane probe cards, and cantilever probe cards are among the most commonly used probe cards. Cobra cards have array-type pins, and are preferable for the present invention. As shown in FIG. 18 the probe pins D and E (such as probe pins of a cobra probe), land on the second temporary test structure 492 not directly on the plurality of the TSVs 201, any probing damage is limited to just the temporary test structure so as not to affect the process or the final device performance. The size of the electrical test pads of the second temporary test structure 492 directly on top of the TSVs 201 is larger than that of the TSVs 201 as shown in FIG. 18, thus the probe pins (such as D and E) will have better contact to the tested substrate during electrical testing. FIG. 18 also exhibits an electrical testing by testing through TSP-strap daisy chain. The dotted line illustrated in the figure represents an electrical continuity between probe pin D and probe pin E. The dotted line only represents a general electrical current flowing route. The real electrical current is flowing from one of the probe pins (such as probe pin D) through the first segment of the second temporary test structure 492(1), the first TSV 201(1), the first segment of the first temporary test structure 491(1), the second TSV 201(2), the second segment of the second temporary test structure 492(2), the third TSV 201(3), the second segment of the first temporary test structure 491(2), the fourth TSV 201(4), the third segment of the second temporary test structure 492(3), to another one of the probe pins (such as probe pin E).

FIG. 19 is a schematic cross-sectional diagram representing the second temporary test structure 492 on the substrate of FIG. 18 being completely removed. The removing method may contain wet chemical etching, RIE, inert gas sputtering, or laser ablation. Proper etchant may be chosen for the RIE process, for example an etchant with a mixture of sulfur hexafluoride ($SF_6$), boron trichloride ($BCl_3$), chlorine ($Cl_2$), carbon tetrafluoride ($CF_4$) and nitrogen ($N_2$) may be used for etching TiW, and a mixture of boron trichloride ($BCl_3$), chlorine ($Cl_2$), and nitrogen ($N_2$) may be used for Cu. Instead of RIE, chemical etching may be used, for example hydrogen peroxide ($H_2O_2$) alone or a solution of ethylenediaminetetraacetic acid (EDTA), $H_2O_2$, and ammonium hydroxide ($NH_4OH$) may be used to etch TiW. Acidic wet Cu etch may include: a nitric acid etch or acidic mixtures etch containing an oxidizing agent, such as hydrogen peroxide, permanganate, ferric ion, bromine, and chromium (VI) and an acid (e.g., acetic or sulfuric). Neutral and alkaline Cu etches may include: ammonium or alkali metal persulfate solutions, ferric chloride based solutions, and ammonium hydroxide based solutions.

After removing the second temporary test structure 492, a layer of a second adhesive is applied over the top surface of the grind side G02 of the substrate, a layer of a second carrier is bonded on top using the layer of the second adhesive, and the substrate is flipped upside down. The second carrier may be a glass carrier, a silicon carrier, or any other suitable carrier. FIG. 20 is a schematic cross-sectional diagram representing the substrate being flipped upside down after a layer of a second carrier 602 being bonded to the top surface of the substrate of FIG. 19 with a layer of a second adhesive 502. The material and process of applying the layer of the second adhesive 502 may be the same as those of the applying of the layer of the first adhesive 501. The material and process of bonding the layer of the second carrier 602 may be the same as those of the bonding of the layer of the first carrier 601.

Figure 22:
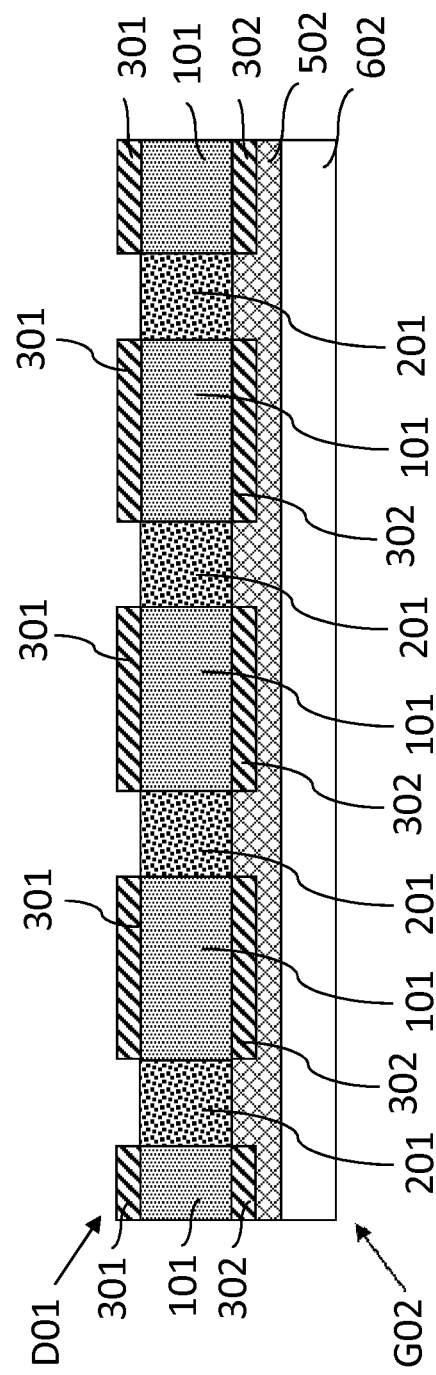
FIG. 22 is a schematic cross-sectional diagram representing the first temporary test structure on the substrate of FIG. 21 being completely removed according to one embodiment of the present invention.

FIG. 21 is a schematic cross-sectional diagram representing the layer of the first carrier 601 being debonded and the layer of the first adhesive 501 being removed from the top surface of the device side D01 of the substrate of FIG. 20 to reveal the first temporary test structure 491. The debonding process may involve chemical or energy to break the layer of the first adhesive 501 to debond the layer of the first carrier 601. When chemical is used, the chemical dissolves the layer of the first adhesive 501 underneath and the layer of the first carrier 601 is lifted-off. For supplying energy, an excimer laser may be used to irradiate the substrate with a short wavelength UV laser light, for example below 360 nm. When the irradiation energy is above a certain value, the material of the layer of the first adhesive 501 is decomposed within the irradiated area so that the adhesive bond layer is opened and the layer of the first carrier 601 is debonded. Due to limited penetration depth of the excimer laser light, there is less likely the irradiation will damage the substrate below the layer of the first adhesive 501. After debonding the layer of the first carrier 601, the layer of the first adhesive 501 may be removed with a stripper to revel the first temporary test structure 491. For example, when HD 3007 is used as the layer of the first adhesive 501, the adhesive can be removed with EKC865 which is available from DuPont EKC Technology. Main components of EKC865 contain N-methyl-pyrrolidone, N-(2-hydroxyethyl)-2-pyrrolidone. After debonding the layer of the first carrier 601 and removing the layer of the first adhesive 501, the first temporary test structure 491 is removed. FIG. 22 is a schematic cross-sectional diagram representing the first temporary test structure 491 on the substrate of FIG. 21 being completely removed. The removing method for the first temporary test structure 491 may be the same as the removing method for the second temporary test structure 492, and may contain wet chemical etching, RIE, inert gas sputtering, or laser ablation. After removing the first temporary test structure 491, the substrate of FIG. 22 may be continually processed with a next normal processing step.

Although illustrative embodiments of the present invention have been described in detail, it should be understood that the present invention is not intended to be limited to the specific embodiments disclosed. Based on the foregoing disclosure, those skilled in the art will be able to make various changes, substitutions and alterations without departing from the spirit and scope of the present invention as defined by the following appended claims.

What is claimed is:

1. A method of forming a temporary test structure for device fabrication comprising:
   providing a substrate comprising a plurality of electrically conductive interconnects extending vertically to top surface of the substrate;
   conformally forming an electrical test layer on top of the substrate, the electrical test layer connecting to the plurality of electrically conductive interconnects;
   patterning the electrical test layer by selectively removing portions of the electrical test layer to form a temporary test structure which comprises unremoved portions of the electrical test layer and comprises providing electrical connection between at least a first test location and a second test location, wherein the first and second test locations are each electrically connected to at least one of the plurality of electrically conductive interconnects;
   performing electrical testing by probing at least the first test location and the second test location on the temporary test structure; and
   removing all or part of the temporary test structure.

2. The method of claim 1, wherein removing part of the temporary test structure comprises removing more than 50% of the temporary test structure.

3. The method of claim 1, wherein material of the electrical test layer is selected from a group consisting of copper (Cu), titanium (Ti), tungsten (W), tantalum (Ta), ruthenium (Ru), chromium (Cr), iridium (Ir), osmium (Os), palladium (Pd), platinum (Pt), and alloys and ceramics thereof.

4. The method of claim 3, wherein material of the electrical test layer comprises titanium tungsten alloy (Ti—W) in a single layer, or comprises copper (Cu) or Cu alloy over titanium (Ti) or titanium tungsten alloy (Ti—W) in a bilayer.

5. The method of claim 1, wherein thickness of the electrical test layer is in a range of about 20 nm to 1200 nm.

6. The method of claim 1, wherein patterning the electrical test layer by selectively removing portions of the electrical test layer to form a temporary test structure comprises:
   performing a laser ablation on the electrical test layer using an excimer laser through an ablation mask, which comprises an electrical testing pattern, to selectively remove portions of the electrical test layer; and
   removing loose material of the electrical test layer to form the temporary test structure comprising the electrical testing pattern.

7. The method of claim 1, wherein the temporary test structure comprises electrical test pads.

8. The method of claim 7, wherein the electrical test pads are in kerf area.

9. The method of claim 1, wherein after conformally forming an electrical test layer and before patterning the electrical test layer the method further comprises:
   forming C4 bumps over the plurality of electrically conductive interconnects.

10. The method of claim 1, wherein removing all or part of the temporary test structure comprises wet chemical etching, reactive ion etching, inert gas sputtering, or laser ablation.

11. The method of claim 1, wherein performing electrical testing comprises probing the temporary test structure with a cobra probe.

* * * * *